US010347794B2

(12) United States Patent
Lochtefeld et al.

(10) Patent No.: US 10,347,794 B2
(45) Date of Patent: Jul. 9, 2019

(54) GALLIUM NITRIDE WAFER SUBSTRATE FOR SOLID STATE LIGHTING DEVICES AND ASSOCIATED SYSTEMS (71) Applicant: QROMIS, Inc., Santa Clara, CA (US)

(72) Inventors: Anthony Lochtefeld, Ipswich, MA (US); Hugues Marchand, Somerville, MA (US)

(73) Assignee: Qromis, Inc., Santa Clara, CA (US)

( * ) Notice: Subject to any disclaimer, the term of this patent is extended or adjusted under 35 U.S.C. 154(b) by 145 days.

(21) Appl. No.: 14/690,154

(22) Filed: Apr. 17, 2015

(65) Prior Publication Data
US 2015/0221832 A1 Aug. 6, 2015

Related U.S. Application Data (62) Division of application No. 12/969,302, filed on Dec. 15, 2010, now Pat. No. 9,012,253.
(Continued)

(51) Int. Cl.
H01L 33/00 (2010.01)
H01L 33/48 (2010.01)
(Continued)

(52) U.S. Cl.
CPC ............ *H01L 33/486* (2013.01); *C30B 29/06* (2013.01); *C30B 33/10* (2013.01);
(Continued)

(58) Field of Classification Search
CPC ................ C30B 29/06; H01L 21/0245; H01L 21/02488; H01L 21/02505;
(Continued)

(56) References Cited

U.S. PATENT DOCUMENTS 4,137,355 A * 1/1979 Heaps .................. C04B 41/009
117/26
4,251,570 A * 2/1981 Zook ..................... C04B 41/009
117/27
(Continued)

FOREIGN PATENT DOCUMENTS

JP 11195814 A 7/1999
JP H11195814 A 7/1999
(Continued)

OTHER PUBLICATIONS

Arslan et al., "The influence of nitridation time on the structural properties of GaN grown on Si(111) substrate", Applied Physics A 94 (2009) pp. 73-82.*
(Continued)

*Primary Examiner* — Jay C Kim
(74) *Attorney, Agent, or Firm* — Kilpatrick Townsend & Stockton LLP (57) ABSTRACT Gallium nitride wafer substrate for solid state lighting devices, and associated systems and methods. A method for making an SSL device substrate in accordance with one embodiment of the disclosure includes forming multiple crystals carried by a support member, with the crystals having an orientation selected to facilitate formation of gallium nitride. The method can further include forming a volume of gallium nitride carried by the crystals, with the selected orientation of the crystals at least partially controlling a crystal orientation of the gallium nitride, and without bonding the gallium nitride, as a unit, to the support member. In other embodiments, the number of crystals can be increased by a process that includes annealing a region in which the crystals are present, etching the region to remove crystals having an orientation other than the selected orien-
(Continued)

tation, and/or growing the crystals having the selected orientation.

19 Claims, 9 Drawing Sheets

Related U.S. Application Data (60) Provisional application No. 61/286,828, filed on Dec. 16, 2009.

(51) Int. Cl.
  *C30B 29/06* (2006.01)
  *C30B 33/10* (2006.01)
  *H01L 21/02* (2006.01)
  *H01L 33/32* (2010.01)
  *H01L 33/16* (2010.01)
  *H01S 5/323* (2006.01)

(52) U.S. Cl.
  CPC ...... *H01L 21/0245* (2013.01); *H01L 21/0254* (2013.01); *H01L 21/02389* (2013.01); *H01L 21/02447* (2013.01); *H01L 21/02458* (2013.01); *H01L 21/02488* (2013.01); *H01L 21/02505* (2013.01); *H01L 21/02513* (2013.01); *H01L 21/02516* (2013.01); *H01L 21/02658* (2013.01); *H01L 33/007* (2013.01); *H01L 33/32* (2013.01); *H01L 33/0079* (2013.01); *H01L 33/16* (2013.01); *H01S 5/32341* (2013.01)

(58) Field of Classification Search
  CPC ......... H01L 21/02513; H01L 21/02516; H01L 21/0254; H01L 33/007; H01L 33/16
  USPC .......................................................... 257/94
  See application file for complete search history.

(56) References Cited

U.S. PATENT DOCUMENTS

| | | | | |
|---|---|---|---|---|
| 4,252,861 A * | 2/1981 | Heaps | ................... | C04B 41/009 117/27 |
| 4,271,235 A * | 6/1981 | Hill | ................... | C23C 16/01 264/81 |
| 4,840,853 A * | 6/1989 | Iio | ................... | C04B 35/581 428/472 |
| 4,901,133 A * | 2/1990 | Curran | ................... | H01L 21/314 257/637 |
| 5,036,373 A * | 7/1991 | Yamazaki | ................... | C23C 16/274 257/103 |
| 5,232,766 A * | 8/1993 | Tokunaga | ................... | C04B 35/111 257/712 |
| 5,264,070 A | 11/1993 | Urquhart et al. | | |
| 5,369,290 A * | 11/1994 | Kawasaki | ................... | H01L 33/0062 257/103 |
| 5,380,372 A * | 1/1995 | Campe | ................... | H01L 31/0236 136/258 |
| 5,659,184 A * | 8/1997 | Tokunaga | ................... | B41J 2/45 257/103 |
| 5,705,321 A * | 1/1998 | Brueck | ................... | B82Y 10/00 257/E21.027 |
| 5,764,673 A * | 6/1998 | Kawazu | ................... | H01L 33/007 257/76 |
| 5,773,377 A * | 6/1998 | Harris | ................... | C04B 35/581 428/698 |
| 5,937,312 A * | 8/1999 | Iyer | ................... | H01L 21/3226 148/DIG. 12 |
| 6,146,457 A * | 11/2000 | Solomon | ................... | C30B 25/02 117/101 |
| 6,326,645 B1 | 12/2001 | Kadota | | |
| 6,328,796 B1 * | 12/2001 | Kub | ................... | C30B 25/02 117/915 |
| 6,391,748 B1 | 5/2002 | Temkin et al. | | |
| 6,392,257 B1 | 5/2002 | Ramdani et al. | | |
| 6,413,627 B1 | 7/2002 | Motoki et al. | | |
| 6,509,579 B2 | 1/2003 | Takeya et al. | | |
| 6,596,377 B1 | 7/2003 | Hersee et al. | | |
| 6,617,060 B2 | 9/2003 | Weeks, Jr. et al. | | |
| 6,693,021 B1 | 2/2004 | Motoki et al. | | |
| 6,764,847 B2 | 7/2004 | Kawaguchi et al. | | |
| 6,764,871 B2 | 7/2004 | Kawaguchi et al. | | |
| 6,794,276 B2 * | 9/2004 | Letertre | ................... | C30B 25/02 257/E21.054 |
| 6,849,878 B2 | 2/2005 | Bader et al. | | |
| 6,867,067 B2 * | 3/2005 | Ghyselen | ................... | H01L 21/3148 257/E21.568 |
| 7,009,270 B2 * | 3/2006 | Letertre | ................... | B81C 1/00365 257/496 |
| 7,011,707 B2 | 3/2006 | Nagai et al. | | |
| 7,138,325 B2 * | 11/2006 | Maleville | ................... | C30B 25/02 117/2 |
| 7,148,514 B2 * | 12/2006 | Seo | ................... | H01L 33/46 257/79 |
| 7,183,578 B2 * | 2/2007 | Akasaki et al. | ................. | 257/79 |
| 7,202,143 B1 * | 4/2007 | Naseem | ................... | H01L 21/02422 257/66 |
| 7,282,381 B2 * | 10/2007 | Feltin | ................... | C30B 25/02 117/922 |
| 7,300,853 B2 * | 11/2007 | Joly | ................... | H01L 21/76251 257/E21.567 |
| 7,365,374 B2 | 4/2008 | Piner et al. | | |
| 7,465,499 B2 * | 12/2008 | Udagawa | ................... | C30B 25/02 117/104 |
| 7,514,282 B2 * | 4/2009 | Li | ................... | B82Y 10/00 438/41 |
| 7,531,428 B2 * | 5/2009 | Dupont | ................... | H01L 21/02032 257/E21.122 |
| 7,566,913 B2 | 7/2009 | Therrien et al. | | |
| 7,598,108 B2 | 10/2009 | Li et al. | | |
| 7,601,217 B2 * | 10/2009 | Faure | ................... | C30B 25/18 117/103 |
| 7,609,737 B2 * | 10/2009 | Matsumura | ................... | H01S 5/028 372/43.01 |
| 7,615,468 B2 * | 11/2009 | Boussagol | ................... | C30B 25/18 257/E21.567 |
| 7,687,334 B2 * | 3/2010 | Zou | ................... | C30B 1/023 257/E21.133 |
| 7,772,599 B2 | 8/2010 | Udagawa | | |
| 7,839,001 B2 * | 11/2010 | Boussagol | ................... | C30B 25/18 257/782 |
| 7,888,235 B2 * | 2/2011 | Letertre | ................... | C30B 25/02 438/458 |
| 8,093,138 B2 * | 1/2012 | Faure | ................... | C30B 25/18 257/E21.568 |
| 8,242,033 B2 * | 8/2012 | Cook | ................... | C30B 11/003 257/75 |
| 8,350,273 B2 | 1/2013 | Vielemeyer | | |
| 8,492,238 B2 * | 7/2013 | Celik-Butler | ......... | G01L 9/0042 438/381 |
| 8,580,593 B2 * | 11/2013 | Pinnington | ....... | H01L 21/76254 257/103 |
| 8,716,749 B2 * | 5/2014 | Kim | ................... | H01L 21/0237 257/190 |
| 8,946,772 B2 * | 2/2015 | Okagawa | ................... | C23C 16/0236 257/190 |
| 9,012,253 B2 | 4/2015 | Lochtefeld et al. | | |
| 2002/0084461 A1 | 7/2002 | Hilt et al. | | |
| 2004/0087116 A1 | 5/2004 | Nakayama | | |
| 2004/0099918 A1 | 5/2004 | Noguchi et al. | | |
| 2004/0123796 A1* | 7/2004 | Nagai | ................... | C30B 25/02 117/103 |
| 2005/0042789 A1 | 2/2005 | Fujikura et al. | | |
| 2005/0087746 A1 | 4/2005 | Kryliouk et al. | | |
| 2006/0046325 A1 | 3/2006 | Usui et al. | | |
| 2007/0200114 A1 | 8/2007 | Udagawa | | |
| 2008/0197358 A1* | 8/2008 | Frahm | ................... | C30B 23/02 257/76 |

(56) References Cited

U.S. PATENT DOCUMENTS

| | | | |
|---|---|---|---|
| 2008/0283823 | A1 | 11/2008 | Udagawa |
| 2008/0290347 | A1* | 11/2008 | Kim .................... C30B 29/406 257/76 |
| 2008/0296584 | A1 | 12/2008 | Hachigo |
| 2008/0308835 | A1 | 12/2008 | Pan |
| 2009/0176018 | A1* | 7/2009 | Zou ........................ C23C 14/18 427/258 |
| 2009/0272975 | A1 | 11/2009 | Chen et al. |
| 2009/0278233 | A1* | 11/2009 | Pinnington ....... H01L 21/02389 257/615 |
| 2009/0321747 | A1 | 12/2009 | Murphy et al. |
| 2010/0221494 | A1* | 9/2010 | Lu .......................... C30B 25/02 428/156 |

FOREIGN PATENT DOCUMENTS

| | | | |
|---|---|---|---|
| JP | 2002222769 | A | 8/2002 |
| JP | 2005019872 | A | 1/2005 |
| JP | 2007201493 | | 8/2007 |
| JP | 2007201493 | A | 8/2007 |
| JP | 2008300562 | A | 12/2008 |
| TW | 417315 | B | 1/2001 |
| TW | 595010 | B | 6/2004 |
| TW | I236056 | B | 7/2005 |
| TW | I236056 | B | 7/2005 |
| TW | 1289941 | A | 1/2006 |
| TW | 200603445 | A | 1/2006 |
| TW | I272732 | B | 2/2007 |
| TW | I272732 | B | 2/2007 |
| TW | 099144397 | A | 9/2011 |
| WO | 03063215 | A1 | 7/2003 |
| WO | 2009038324 | A2 | 3/2009 |

OTHER PUBLICATIONS

Nakada et al., "GaN heteroepitaxial growth on silicon nitride buffer layers formed on Si(111) surfaces by plasma-assisted molecular beam epitaxy", Applied Physics Letters 73 (1998) pp. 827-829.*
Krost et al., "GaN-based optoelectronics on silicon substrates", Materials Science and Engineering B93 (2002) pp. 77-84.*
Kawaguchi et al., "Selective Area Growth of GaN on Si Substrate Using SiO2 Mask by Metalorganic Vapor Phase Epitaxy", Japanese Journal of Applied Physics 37 (1998) pp. L966-L969.*
Furumura et al., "Selective Growth of Polysilicon", Journal of Electrochemical Society 133 (1986) pp. 379-383.*
Kim et al., "Al-Induced Crystallization of an Amorphous Si Thin Film in a Polycrystalline Al/Native SiO2/Amorphous Si Structure", Japanese Journal of Applied Physics 35 (1996) pp. 2052-2056.*
Harbeke et al., "Growth and Physical Properties of LPCVD Polycrystalline Silicon Films", Journal of Electrochemical Society 131 (1984) pp. 675-682.*
Lee et al., "Oxidation behavior of AlN substrate at low temperature", Journal of Materials Science: Materials in Electronics 13 (2002) pp. 131-137.*
Yue et al., "SIMS study on the initial oxidation process of AlN ceramic substrate in the air", Applied Surface Science 148 (1999) pp. 73-78.*
Werdecker et al., "Aluminum Nitride—An Alternative Ceramic Substrate for High Power Applications in Microcircuits", IEEE Transactions on Components, Hybrids, and Manufacturing Technology CHMT-7 (1984) pp. 399-404.*
Tseng et al., "Oxidation, microstructure and metallization of aluminum nitride substrates", Journal of Materials Science: Materials in Electronics 11 (2000) pp. 131-138.*
Koh et al., "Strengthening and Prevention of Oxidation of Aluminum Nitride by Formation of a Silica Layer on the Surface", Journal of American Ceramic Society 83 (2000) pp. 306-310.*
Atwater Jr., H.A., Ion Beam Enhanced Grain Growth in Thin Films, RLE Technical Report No. 527, Massachusetts Institute of Technology, Research Laboratory of Electronics, pp. 1-224, Mar. 1987.

Givargizov, E.I., Graphoepitaxy as an Approach to Oriented Crystallization on Amorphous Substrates, Journal of Crystal Growth, vol. 310, No. 7-9, pp.-1686-1690, Apr. 2008.
Office Action dated Jul. 17, 2012 for U.S. Appl. No. 12/969,302, filed Dec. 15, 2010, 10 pages.
Office Action dated Feb. 28, 2013 for U.S. Appl. No. 12/969,302, filed Dec. 15, 2010, 16 pages.
Office Action dated Jul. 1, 2013 in Taiwan Application No. 099144397, 5 pages.
Office Action dated Sep. 11, 2013 in Korean Application No. 10-2012-7017549, 12 pages.
Office Action dated May 15, 2014 in Korean Patent Application No. 10-2014-7006513, 8 pages.
Office Action dated May 23, 2014 in Chinese Patent Application No. 201 080057499.X, 28 pages.
Office Action dated Jun. 27, 2014 for U.S. Appl. No. 12/969,302, filed Dec. 15, 2010, 34 pages.
Office Action dated Jul. 23, 2014 in Korean Patent Application No. 10-2012-7017549, 6 pages.
Notice of Allowance dated Dec. 16, 2014 for U.S. Appl. No. 12/969,302, filed Dec. 15, 2010, 10 pages.
Extended European Search Report in European Application No. 10842599.2, dated Feb. 4, 2015, 7 pages.
International Search Report and Written Opinion for International Application No. PCT/US2010/060761, dated Aug. 29, 2011, 9 pages.
Office Action dated Feb. 27, 2015 in Korean Patent Application No. 10-2014-7006513, 6 pages.
Office Action dated Feb. 27, 2015 in Korean Patent Application No. 10-2012-7017549, 6 pages.
Atwater Jr., H.A., Ion Beam Enhanced Grain Growth in Thin Films, RLE Technical Report No. 527, Massachusetts Institute of Technology, Research Laboratory of Electronics, pp. 1-224, Mar. 1987.
Atwater, H.A. et al., Mechanisms for Crystallographic Orientation in the Crystallization of Thin Silicon Films from the Melt, J. Mater. Res., vol. 3, No. 6, pp. 1232-1237, Nov./Dec. 1988.
Atwater, H.A. et al., Zone-Melting Recrystallization of Thick Silicon on Insulator Films, Materials Letters, vol. 2, No. 4A, pp. 269-273, Mar. 1984.
Choi, J.-H. et al. Zone Melting Recrystallization of Polysilicon by a Focused-Lamp with Unsymmetric Trapezoidal Power Distribution, Journal of Electronic Materials, vol. 20, No. 3, pp. 231-235, Mar. 1991.
Colinge, J.-P., Silicon-on-Insulator Technology: Materials to VLSI, 2nd Edition, pp. 16-27 and 52-65, Sep. 1997.
Geis, M.W. et al., (Invited) Silicon Graphoepitaxy, Proceedings of the 12th Conference on Solid State Devices, Tokyo 1980, Japanese Journal of Applied Physics, vol. 20, Supplement 20-1, pp. 39-42, 1981.
Geis, M.W. et al., Grapho-Epitaxy of Silicon on Fused Silica using Surface Micropatterns and Laser Crystallization, J. Vac. Sci. Technol., vol. 16, No. 6, pp. 1640-1643, Nov./Dec. 1979.
Geis, M.W. et al., Summary Abstract: Silicon Graphoepitaxy, J. Vac. Sci. Technol., vol. 18, No. 2, pp. 229-230, Mar. 1981.
Geis, M.W. et al., Zone-Melting Recrystallization of Si Films with a Moveable-Strip-Heater Oven, J. Electrochem. Soc.: Solid State Science and Technology, vol. 129, No. 12, pp. 2812-2818, Dec. 1982.
Givargizov, E. I., Graphoepitaxy as an Approach to Oriented Crystallization on Amorphous Substrates, Journal of Crystal Growth, vol. 310, No. 7-9, pp. 1686-1690, Apr. 2008.
Klykov, V.I. et al. Artificial Epitaxy (Diataxy) of Silicon and Germanium, Acta Physica Academiae Scientiarum Hungaricae, vol. 47, Nos. 1-3, pp. 167-183, Mar. 1979.
Minagawa, Y. et al. Fabrication of (111)-Oriented Si Film with a Ni!Ti Layer by Metal Induced Crystallization, Jpn. J. Appl. Phys., vol. 20, Part 2, No. 3A, pp. L 186-L1 88, Mar. 2001.
Moon, B.Y. et al. Study on the Polycrystalline Silicon Films Deposited by Inductively Coupled Plasma Chemical Vapor Deposition, Mat. Res. Soc. Symp. Proc., vol. 685E, pp. D5.2.1-D5.2.6, 2001.

(56) References Cited

OTHER PUBLICATIONS

Naomoto, H. et al., Characterization of Thin-Film Silicon Formed by High-Speed Zone-Melting Recrystallization Process, Solar Energy Materials and Solar Cells, vol. 48, Nos. 1-4, pp. 261-267, Nov. 1997.

Pauli, M. et al., Large Area and Rapid Thermal Zone Melting Crystallization of Silicon Films on Graphite Substrates for Photovoltaic Use, Conference Record of the 23rd IEEE Photovoltaic Specialists Conference, pp. 195-200, May 1993.

Scharff, W. et al., Flash-Lamp-Induced Crystal Growth of Silicon on Amorphous Substrates Using Artificial Surface—Relief Structures, Physica Status Solidi (a), vol. 74, No. 2, pp. 545-552, Dec. 1982.

Wan, J. et al., Growth of Crack-Free Hexagonal GaN Films on Si(1 00), Applied Physics Letters, vol. 79, No. 10, pp. 1459-1461, Sep. 2001.

Yoon, S.M. et al., Numerical Simulation of Scanning Speed and Supercooling Effects During Zone-Melting-Recrystallization of SOI Wafers, Mat. Res. Soc. Symp. Proc., vol. 205, pp. 453-458, 1990.

\* cited by examiner

GALLIUM NITRIDE WAFER SUBSTRATE FOR SOLID STATE LIGHTING DEVICES AND ASSOCIATED SYSTEMS

CROSS-REFERENCE TO RELATED APPLICATIONS

This application is a divisional of U.S. application Ser. No. 12/969,302, filed Dec. 15, 2010, now U.S. Pat. No. 9,012,253, which claims priority to U.S. Provisional Application No. 61/286,828, filed on Dec. 16, 2009, each of which is incorporated herein by reference. To the extent the foregoing application and/or any other materials incorporated herein by reference conflict with the present disclosure, the present disclosure controls.

TECHNICAL FIELD

The present disclosure is generally related to wafer fabrication, and more particularly is related to a substrate, system and method for growing gallium nitride suitable for use in solid state lighting devices.

BACKGROUND

Figure 1A:
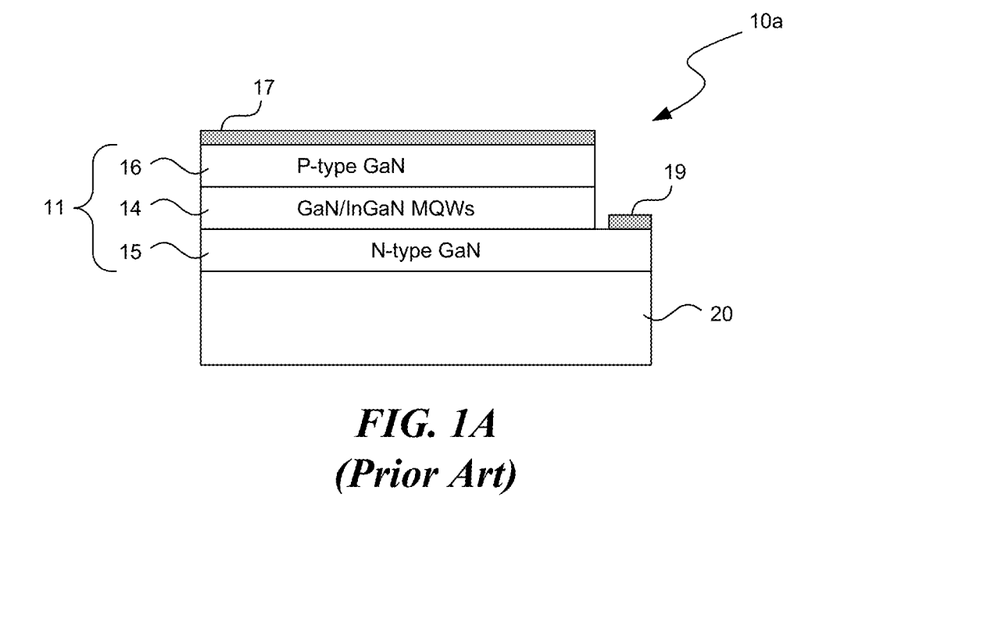
FIG. 1A is a schematic cross-sectional diagram of an SSL device in accordance with the prior art.
Figure 1B:
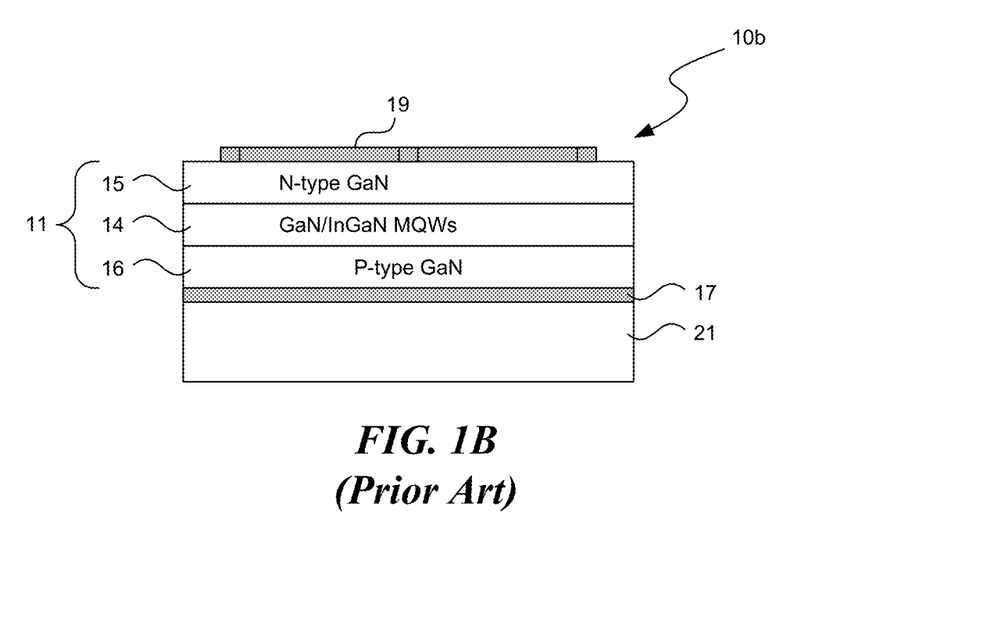
FIG. 1B is a schematic cross-sectional diagram of another SSL device in accordance with the prior art.

Mobile phones, personal digital assistants ("PDAs"), digital cameras, MP3 players, and other portable electronic devices utilize solid state lighting ("SSL") devices (e.g., LEDs) for background illumination. SSL devices are also used for signage, indoor lighting, outdoor lighting, and other types of general illumination. FIG. 1A is a cross-sectional view of a conventional SSL device 10a with lateral contacts. As shown in FIG. 1A, the SSL device 10a includes a substrate 20 carrying an LED structure 11 having an active region 14, e.g., containing gallium nitride/indium gallium nitride (GaN/InGaN) multiple quantum wells ("MQWs"), positioned between N-type GaN 15, and P-type GaN 16. The SSL device 10a also includes a first contact 17 on the P-type GaN 16 and a second contact 19 on the N-type GaN 15. The first contact 17 typically includes a transparent and conductive material (e.g., indium tin oxide ("ITO")) to allow light to escape from the LED structure 11. FIG. 1B is a cross-sectional view of another conventional LED device 10b in which the first and second contacts 17 and 19 are opposite of each other, e.g., in a vertical rather than lateral configuration. During formation of the LED device 10b, a substrate 20, similar to the substrate 20 shown in FIG. 1A, initially carries an N-type GaN 15, an active region 14 and a P-type GaN 16. The first contact 17 is disposed on the P-type GaN 16, and a carrier 21 is attached to the first contact 17. The substrate 20 is removed, allowing the second contact 19 to be disposed on the N-type GaN 15. The structure is then inverted to produce the orientation shown in FIG. 1B. In the LED device 10b, the first contact 17 typically includes a reflective and conductive material (e.g., aluminum) to direct light toward the N-type GaN 15.

As discussed in more detail below, the various elements of the SSL devices typically have different coefficients of thermal expansion (CTE). During temperature excursions that occur in manufacturing processes and/or during use, the difference in CTEs of the device elements may cause the elements to crack or delaminate. Due to differences in the coefficient of thermal expansion (CTE) for the various elements that form the wafers used for SSL manufacturing, and in particular, the CTE of sapphire relative to the CTE of GaN, wafers over four inches in diameter may be difficult to produce in a manner that results in high yields. Accordingly, there remains a need for substrates that improve the performance and reliability of the resulting device, and that reduce the cost and time associated with manufacturing such devices.

BRIEF DESCRIPTION OF THE DRAWINGS

Many aspects of the present disclosure can be better understood with reference to the following drawings. The components in the drawings are not necessarily to scale. Instead, emphasis is placed upon illustrating clearly the principles of the present disclosure. Moreover, in the drawings, like reference numerals designate corresponding parts throughout the several views.

DETAILED DESCRIPTION

Embodiments of the present disclosure are directed generally to substrates for growing gallium nitride, and associated systems and methods. The gallium nitride can be used to form solid state lighting ("SSL") devices. As used hereinafter, the term "SSL device" generally refers to devices with light emitting diodes ("LEDs"), organic light emitting diodes ("OLEDs"), laser diodes ("LDs"), polymer light emitting diodes ("PLEDs"), and/or other suitable sources of illumination other than electrical filaments, a plasma, or a gas. Briefly described, one embodiment of the system includes a support substrate, an intermediate structure formed on the support substrate, and a seed material formed on the intermediate structure. An amorphous and/or at least partially crystal-oriented material (e.g., silicon with a (111) crystal orientation) is disposed on the seed material, e.g., by plasma-enhanced chemical vapor deposition (PECVD). The amorphous and/or at least partially crystal-oriented material can be annealed and selectively etched to increase the number of crystals with a (111) crystal orientation. At this point, the material is at least partially crystal-oriented, even if it was amorphous prior to annealing. The system can further include an epitaxially-grown gallium nitride (GaN) material (e.g., a GaN layer) over the crystals. It is expected that embodiments of the present disclosure can provide advantages over existing methods by eliminating the need for bonding a silicon- and/or gallium-nitride-containing substrate to an aluminum-nitride-containing substrate or other substrate that is thermally tailored to support GaN. Instead, the silicon and/or gallium nitride can be formed in situ on a single substrate.

Other systems, methods, features, and advantages of the present disclosure will be or become apparent to one of ordinary skill in the art. Several details describing structures or processes that are well-known and often associated with the disclosed systems and methods, but that may unnecessarily obscure some significant aspects of the disclosure, are not set forth in the following description for purposes of clarity. Moreover, although the following disclosure sets forth several embodiments of different aspects of the technology disclosed herein, several other embodiments can have different configurations or different components than those described in this section. Accordingly, the disclosed technology may have other embodiments with additional elements, and/or without several of the elements described below with reference to FIGS. 2-8.

Figure 2:
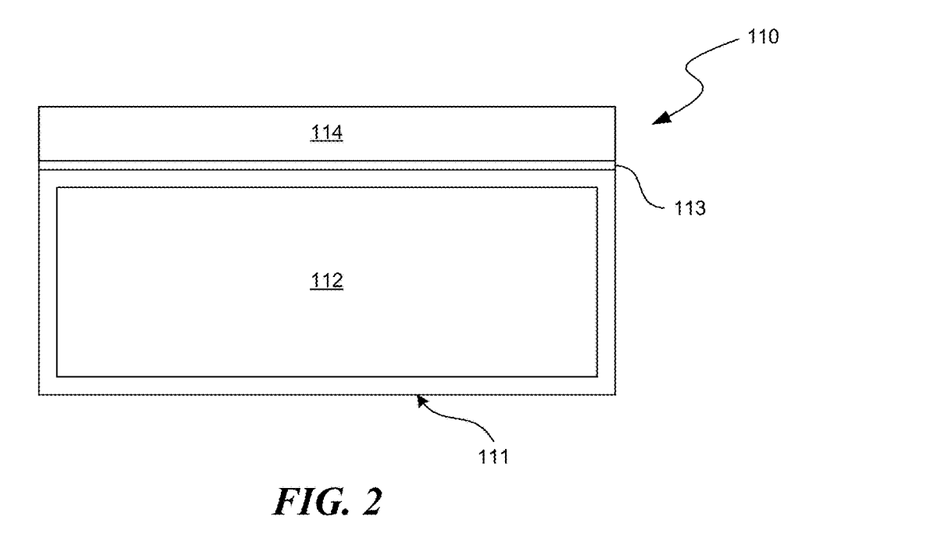
FIG. 2 is a partially schematic, cross-sectional illustration of a support member configured in accordance with an embodiment of the present disclosure.

FIG. 2 is a partially schematic, cross-sectional illustration of a support member 110 (e.g., a wafer), configured in accordance with an embodiment of the present disclosure. The support member 110 can include a support substrate 112. The support substrate 112 can include materials having suitable properties that facilitate forming the additional structures described herein. In particular embodiments, the material selected for the support substrate 112 can include polycrystalline aluminum nitride (pAlN), or another material selected for its thermal expansion characteristics. Such characteristics include a coefficient of thermal expansion (CTE) that is approximately the same as or otherwise approximates or approaches the CTE for the subsequently formed GaN material. By selecting the material for the support substrate 112 in this manner, the quality, uniformity and/or producability of the GaN material can be improved. Further details regarding aspects of suitable support substrates 112 and associated methods are included in copending U.S. application Ser. No. 12/861,706, filed on Aug. 23, 2010, published as U.S. Publication No. 2011/0121310, and incorporated herein by reference.

The support substrate 112 can include a suitable encapsulation layer 111 to prevent or at least restrict materials from diffusing from the support substrate 112 during subsequent processes. The encapsulation material 111 can also be selected to match or approach the CTE of the subsequently deposited GaN. In at least some embodiments, the encapsulation material 111 includes silicon nitride or another silicon-based compound. An outer surface of the encapsulation material 111 can include an oxide 113, e.g., a layer of silicon dioxide. In at least some embodiments, the silicon dioxide by itself can support subsequently disposed materials. In other embodiments, an intermediate structure 114 shown in FIG. 2 can perform this function.

The intermediate structure 114 can include silicon dioxide, silicon nitride, silicon carbide, or another suitable material selected to compensate, at least in part, for CTE differences between the support substrate 112 and subsequently disposed materials. Accordingly, the intermediate structure 114 can minimize or at least reduce bowing at temperatures that are useful for metal-organic chemical vapor deposition (MOCVD), e.g. temperatures from about 570° C. to about 1100° C. The foregoing materials of the intermediate structure 114 can be disposed on the support substrate 112 in the form of sequential layers, in particular embodiments. In another embodiment, the intermediate structure 114 can include silicon carbide which is then oxidized to produce the silicon carbide and silicon dioxide constituents of the intermediate structure 114. The characteristics of these layers can be selected in a manner that depends at least in part on the range of GaN thicknesses that are subsequently deposited on the support member 110, for example, as described in co-pending U.S. application Ser. No. 12/878,815, filed on Sep. 9, 2010, published as U.S. Publication No. 2011/0057165, and incorporated herein by reference. The layer characteristics can also be selected to provide chemical compatibility with subsequent processes and/or subsequently disposed materials. One or more of the layers may be combined, eliminated, or removed depending on the process details.

Figure 3:
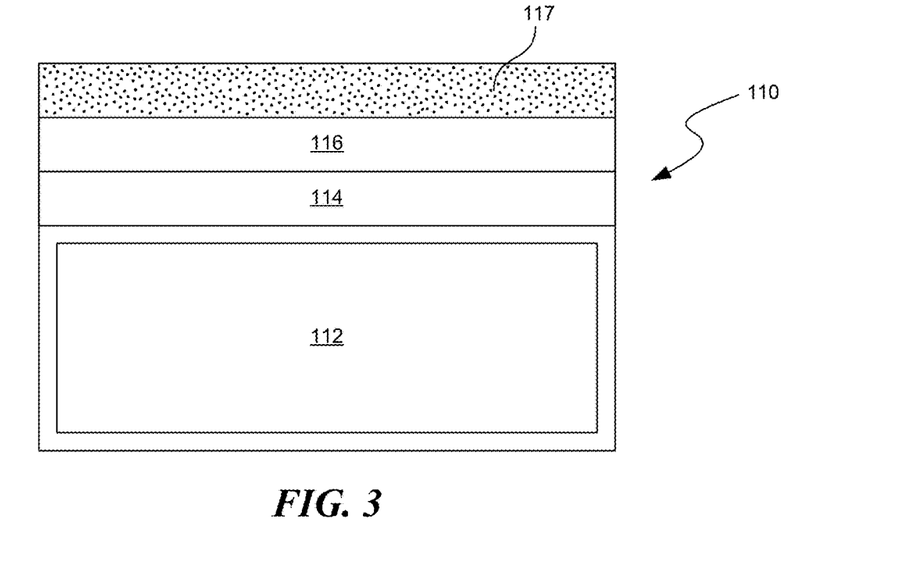
FIG. 3 is a partially schematic, cross-sectional illustration of the support member shown in FIG. 2 with a seed material and an at least partially crystal-oriented material in accordance with an embodiment of the present disclosure.

FIG. 3 is a partially schematic cross-sectional illustration of the support member 110 of FIG. 1 with a seed material 116 (e.g., a seed layer) and an initial material 117 disposed thereon, in accordance with an embodiment of the present disclosure. In particular embodiments, the seed material 116 includes aluminum nitride or a combination of titanium disposed on the intermediate structure 114 and nickel disposed on the titanium. The foregoing materials can be disposed via evaporation processes or other suitable processes. The initial material 117 can include an amorphous material and/or an at least partially crystal-oriented material (hereinafter, "crystal-oriented material"). The initial material 117 can be disposed on the seed material 116 by thermal or e-beam evaporation, sputtering, CVD, PECVD, atomic layer deposition (ALD), or another suitable technique. When the initial material 117 includes an amorphous component, the amorphous component generally does not include crystals. When the initial material 117 includes a crystal-oriented material, the microstructure of the crystal-oriented material includes at least some crystals oriented in a common direction. For example, the crystal-oriented material can be polycrystalline (e.g., polysilicon), or can include a mixture of grains having various crystalline orientations. Known deposition techniques may be used to produce films with relatively high fractions of grains oriented along specific directions. For example, when the crystal-oriented material includes polysilicon, such techniques can be used to deposit the crystal-oriented material with at least some crystals having a (111) orientation, which is typically desirable for support a subsequent GaN layer having an (0001) crystal orientation. In other embodiments, e.g., if the crystal-oriented material is primarily composed of an element other than silicon, the crystal-oriented material can have a high fraction of grains that are oriented in a direction other than (111), while still providing a suitable support for a subsequent GaN layer having a (0001) crystal orientation. In still further embodiments, the crystal-oriented material can have grains oriented in a direction that supports GaN with a crystal orientation other than (0001). In at least some embodiments, the initial material 117 can be patterned, e.g., in stripes or other shapes (e.g., using a photolithographic masking and etching process) to enhance the effects of subsequent chemical treatments. In some cases, enhancing these effects includes higher rates of recrystallization. In any of these embodiments, the degree of crystallinity in the initial material 117 may be developed, established and/or improved by a combination of physical and chemical reactions/processes, as will be described further with reference to FIGS. 4A-4C.

The initial material 117 includes silicon in some embodiments and in particular embodiments, only silicon. In other embodiments, the initial material 117 includes materials other than silicon, provided they form a suitable starting layer for GaN growth. Such materials include, but are not limited to, AN, SiC, $Al_2O_3$ (sapphire), and spinel. In particular embodiments, the initial material 117 can include GaN. In other embodiments, however, GaN is not included in the support member 110 until it is disposed in the process described later with reference to FIG. 5. The materials can be disposed on the support member 110 via any of a variety of suitable techniques, including thermal or e-beam evaporation, DC or RF sputtering, electroplating, molecular beam epitaxy (MBE), ALD, pulsed-laser deposition (PLD), spin coating, MOCVD, hydride vapor phase epitaxy (HVPE), and liquid phase epitaxy (LPE). In a particular embodiment, the initial material 117 includes polysilicon deposited in a low pressure CVD process (LPCVD) using silane as a precursor gas. The initial material 117 can be annealed and/or can undergo chemical reactions following deposition, or after additional materials or reactants are deposited or placed in proximity to it. The resulting structure can have an enhanced or increased degree of crystallinity, ranging up to a single-crystal structure.

Figure 4A:
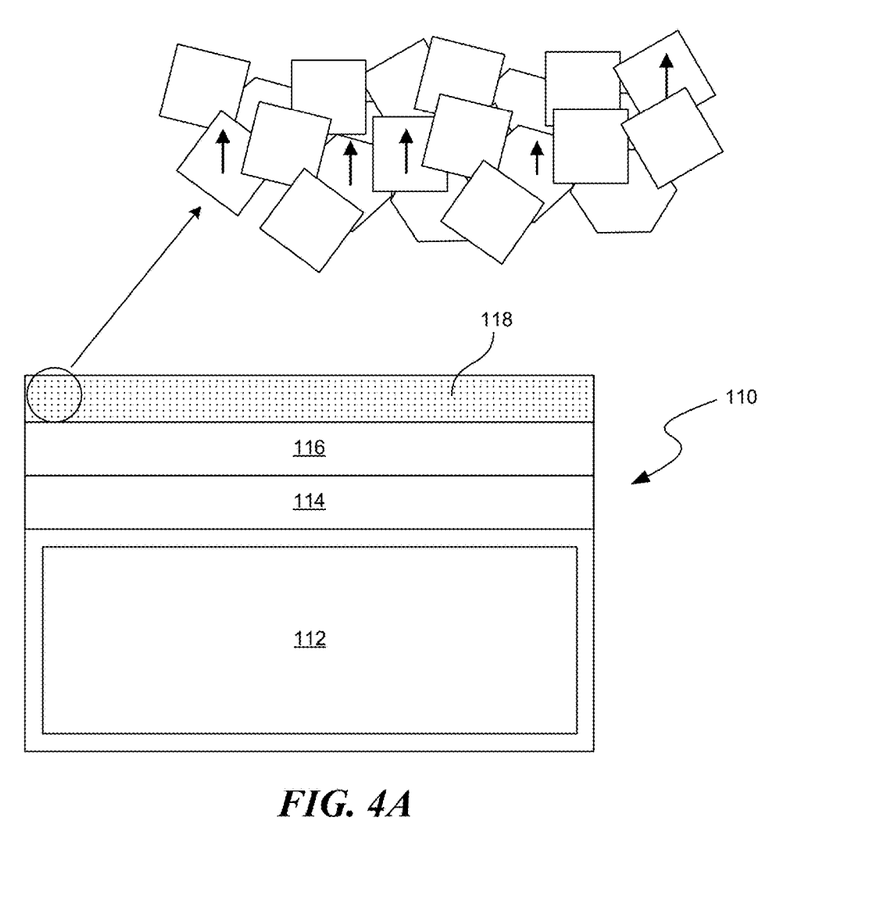
FIG. 4A is a partially schematic, cross-sectional illustration of the support member shown in FIG. 3 with the at least partially crystal-oriented material annealed in accordance with an embodiment of the present disclosure.

FIG. 4A is a partially schematic, cross-sectional view of the support member 110 shown in FIG. 3, with the initial material 117 shown in FIG. 3 annealed to form a crystal-oriented material 118. Accordingly, even if the initial material 117 included an amorphous component prior to annealing, the post-anneal, crystal-oriented material 118 shown in FIG. 4A has at least some crystals oriented in a common direction. If the initial material 117 already included a crystal-oriented material component, the annealing process causes the number or population of crystals having a particular crystal orientation to increase. For example, when the seed material 116 and/or the intermediate structure 114 are selected to favor the growth of crystals having a (111) orientation, annealing the initial material 117 can cause additional crystals to form and/or align with the (111) orientation (indicated schematically by the upwardly pointing arrows in FIG. 4A). Typical annealing parameters include temperatures in the range of from about 450° C. to about 900° C. In at least some embodiments, the annealing process can include a zone melt recrystallization process in which areas of the initial material 117 are sequentially exposed to high temperatures, forming a recrystallization "front" that progresses through the material 117. Other annealing processes are used in other embodiments, and in any of these embodiments, the process can increase the population of crystals having the (111) orientation, thus facilitating the subsequent growth of device-quality GaN films. The crystallization process can include other techniques to further enhance crystallinity, as described further below.

Figure 4B:
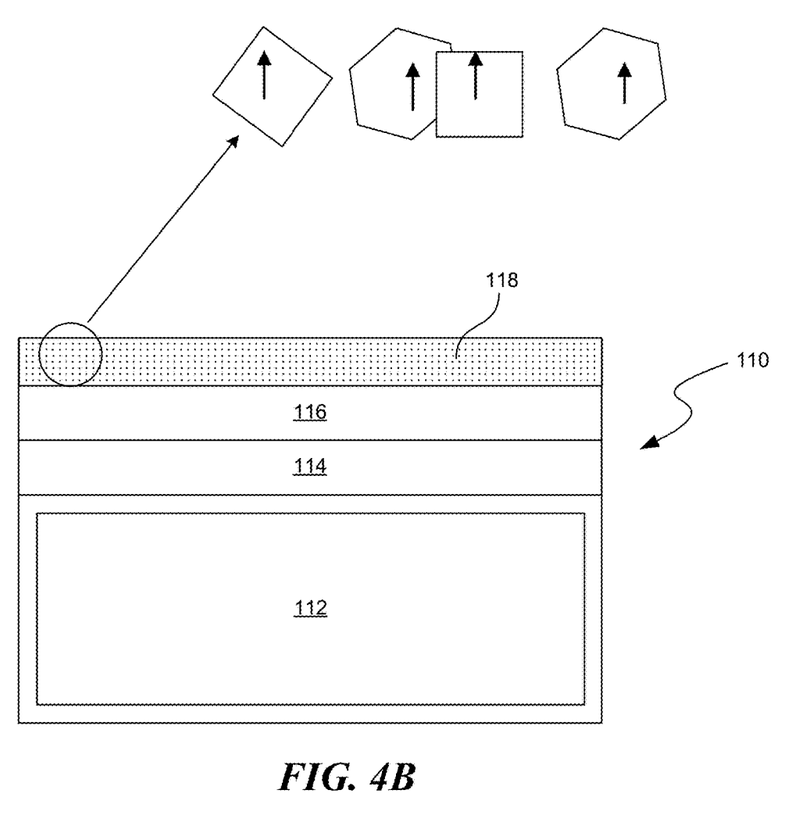
FIG. 4B is a partially schematic, cross-sectional illustration of the support member shown in FIG. 4A after a preferential etch in accordance with an embodiment of the present disclosure.

FIG. 4B is a partially schematic, cross-sectional illustration of the support member 110 shown in FIG. 4A. In FIG. 4B, the crystal-oriented material 118 has undergone a preferential etch process in accordance with an embodiment of the present disclosure. The preferential etch process can be used to remove grains with a less desirable orientation, e.g., grains with an orientation other than (111). For example, Si (001) etches much faster than Si (111) in KOH. The (111) grains may shrink but not completely disappear while still providing the crystal-oriented material 118 with a greater fraction of crystals having the (111) orientation. After this preferential etching, a combination of annealing and chemical reaction steps may be performed to modify the physical and chemical properties of the crystal-oriented material 118 and/or the seed material 116 which can be exposed during the etching process. The preferential etch may include selective wet etch processes and/or other processes, such as oxidation processes, diffusion processes, or other processes with or without dependence on crystal orientation. Accordingly, the overall preferential etch process can be performed to selectively remove grains having crystal orientations other than (111), but the process can include steps or subprocesses that are not dependent on crystal orientation.

Figure 4C:
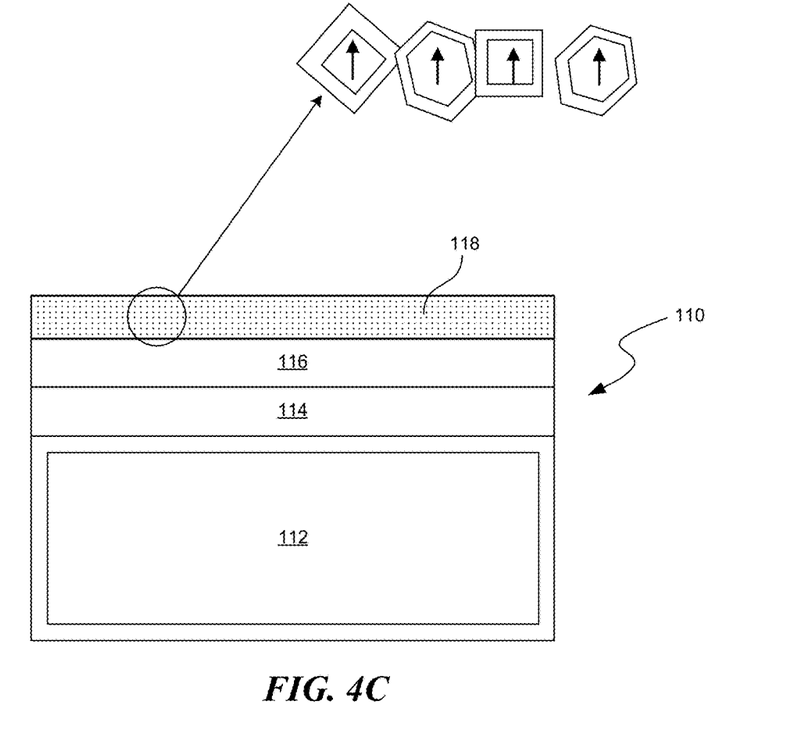
FIG. 4C is a partially schematic, cross-sectional illustration of the support member shown in FIG. 4B with the crystals of the at least partially crystal-oriented material regrown in accordance with an embodiment of the present disclosure.

FIG. 4C is a partially schematic, cross-sectional view of the support member 110 shown in FIG. 4B after the crystal-oriented material 118 has undergone a regrowth process in accordance with an embodiment of the present disclosure. In a particular aspect of this embodiment, the crystal-oriented material 118 undergoes a regrowth process that can increase the size of the crystals having the desired orientation (e.g., the (111) orientation), thus increasing the surface area of such crystals. The regrowth process can include successively running the support member 110 through a silicon epitaxial reactor, or through a GaN epitaxial reactor running silicon precursors (e.g., silane). After the regrowth process, the crystal-oriented material 118 can be further annealed to increase the level of (111) crystallization. The foregoing annealing, removal and growing operations may be performed repeatedly to increase the level of (111) crystal orientation, thus facilitating the subsequent growth of device-quality GaN films.

Figure 5:
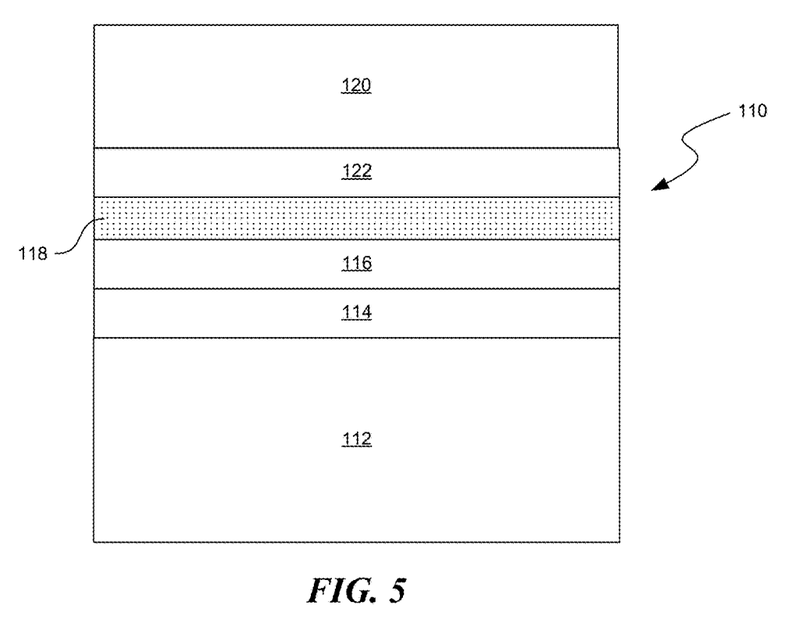
FIG. 5 is a partially schematic, cross-sectional illustration of the support member shown in FIG. 4C with a gallium nitride layer formed in accordance with an embodiment of the present disclosure.

FIG. 5 is a partially schematic cross-sectional view of the support member 110 shown in FIGS. 4A-4C with a gallium nitride material 120 (e.g., a GaN layer) formed thereon, in accordance with an embodiment of the present disclosure. As shown in FIG. 5, an optional buffer material 122 can be formed on the crystal-oriented material 118 to enhance the formation of the GaN material 120. For example, the buffer material 122 can include aluminum gallium nitride ($Al_xGa_{1-x}N$ (0<x≤1), or AlGaN), with the crystal-oriented material 118 serving as an appropriate base surface on which the AlGaN is epitaxially grown. A thin silicon nitride layer can be disposed on or included in the buffer material 122. The GaN material 120 can be disposed via a suitable crystal-growth process, e.g., MOCVD or HVPE. The particular process can be selected based on the desired end results. For example, HVPE processes are generally faster than MOCVD processes, and can accordingly be used to grow relatively thick GaN layers, e.g., from about 10 μm to about 300 μm thick and in a representative embodiment, about 50 μm or more thick. Such thick layers may be particularly suitable for large wafers (e.g., wafers having a diameter of at least six inches) to reduce dislocation densities. Such a support member, e.g., a support member 110 having a thick layer of GaN (initially without a light-emitting material) and a support substrate 112 with a CTE selected to match or approximate the GaN CTE is accordingly expected to perform better during typical LED formation processes than are existing substrates and support members. Even greater film thicknesses (e.g., greater than 300 μm thick) can in some instances be used to produce a stand-alone GaN substrate, if the remaining portions of support member 110 are removed. For example, it is expected that a 500 μm thick layer (or a thicker layer) on a six-inch support member wafer can be self-supporting, allowing the remainder of the support member to be removed after the GaN layer is formed. The thickness of the layer can be 500 μm or more (e.g., up to or greater than 1000 μm) for wafers having larger diameters (e.g., greater than six inches). In general, thicker layers are expected to result in lower dislocation densities.

The crystal-oriented material 118 can be sufficiently thin that the thermal expansion characteristics of the overall structure are dominated by the underlying portion of the support member 110 (e.g., by the support substrate 112). In particular embodiments, the GaN material 120 and/or the buffer material 122 may have relatively high concentrations of microstructural defects and/or voids at the onset of growth. After a few microns of growth, it is expected that the GaN film will fully coalesce, resulting in a defect density low enough to produce GaN suitable for SSL devices such as LEDs. In any of the foregoing embodiments, the degree and microstructure of (111) crystallization is expected to at least partially control the formation (e.g., the crystal orientation) of the GaN material 120, with or without the buffer material 122. For example, it is expected that the increased level of (111) crystallinity in the crystal-oriented material 118 will decrease the density of threading dislocations in the overlying GaN material 120. In particular embodiments, the resulting GaN material 120 can have a dislocation density of $10^{10}/cm^2$ or less, and more particularly, $10^9/cm^2$ or less, e.g., in the light-emitting region of the GaN.

Certain aspects of the embodiments described herein can be modified or combined to produce the desired GaN features. For example, the various elements and/or process parameters used to form the structures described above can be selected based on the starting characteristics of the support substrate 112 or on the characteristics of successive materials disposed on the support substrate 112. The characteristics of the resulting structure may also be selected based on the requirements of the final SSL device or other device to be constructed with the GaN material.

Figure 6:
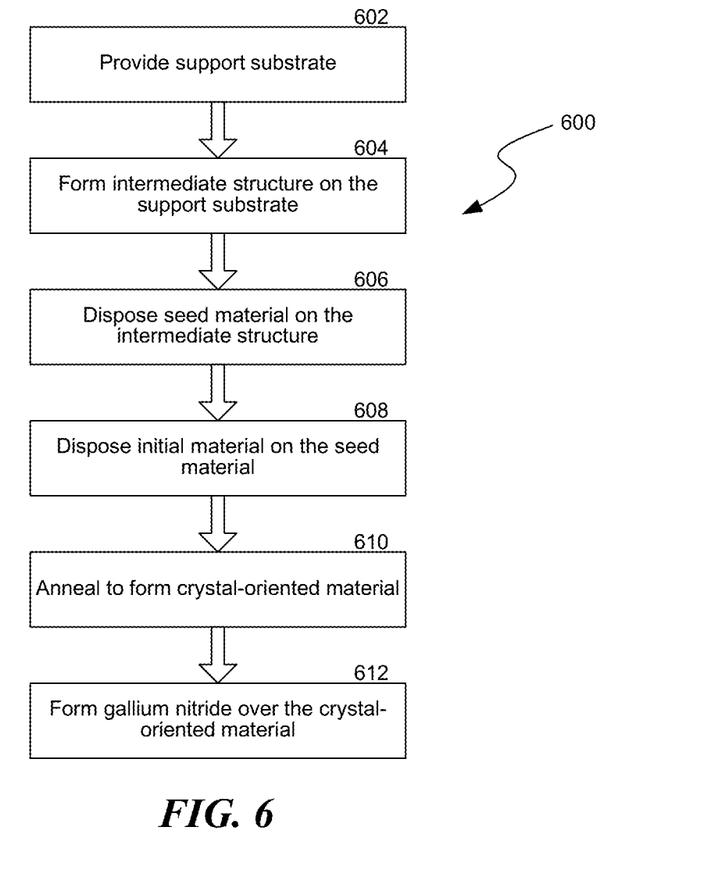
FIG. 6 is a flowchart illustrating a method of forming the support member shown in FIGS. 2-5, in accordance with an embodiment of the present disclosure.

FIG. 6 is a flowchart 600 illustrating a method for growing gallium nitride 120 on a substrate 112 to form the support member 110, in accordance with an embodiment of the present disclosure. It should be noted that any process descriptions or blocks in the flow chart can represent modules, segments, portions of code, or steps that include one or more instructions (e.g., instructions encoded on a computer-readable medium) for implementing specific logical functions in the process. In other embodiments, certain functions may be executed in an order different from that shown or described below, including substantially concurrently or in reverse order, depending on the functionality involved, as will be understood by those of ordinary skill in the relevant art.

Block 602 includes providing a support substrate, e.g., any of the support substrates described above. Block 604 includes forming an intermediate structure on the support substrate, and block 606 includes disposing a seed material on the intermediate structure. As discussed above, the intermediate structure and the seed material can be selected and disposed to facilitate growing a GaN structure with a (0001) or other selected crystal orientation. As was also discussed above, in at least some embodiments, the functions of the intermediate structure and/or the seed material can be combined or performed by other structures. Block 608 includes forming an initial material on the seed material (or in another manner in which it is carried by the support substrate), e.g., by PECVD or another suitable process. In block 610, the initial material is annealed and/or otherwise processed to form a crystal-oriented material with an increased number, population, and/or extent of crystals having a selected orientation, e.g., a (111) orientation for silicon. An optional buffer layer can be formed over the crystal-oriented material to support the gallium nitride material, which is then formed (e.g., epitaxially grown) on, over, or otherwise, so as to be carried by the crystal-oriented material (block 612).

One feature of the foregoing process is that it can be completed without bonding preformed structures, as a unit, to the support substrate. For example, the foregoing process does not require that a separate substrate (e.g., a wafer) carrying a silicon or gallium nitride layer be bonded as a unit (e.g., via Van der Waal's forces) to a corresponding thermally matched or otherwise tailored substrate carrying an aluminum nitride or other layer. Instead, aspects of the present disclosure are directed to using a deposition and/or growth process to build a suitable structure from much smaller elements, typically on the order of microns in size. In particular, the processes described above can form a crystal-oriented material having a crystal structure that is predominantly in a predetermined direction (e.g., (111) in the case of silicon), with the predetermined direction selected to facilitate, enhance and/or otherwise improve the composition of the subsequently-formed GaN material. The GaN material is then formed to have crystals also oriented predominantly in a preferred or selected direction (e.g., (0001)).

An advantage of the present arrangement is that the existing wafer bonding processes typically require high forces between the structures (wafers) that are bonded to each other. Most existing fabrication tools used to perform such bonding processes are limited to a peak force. As the wafers or other substrates supporting such structures increase in size, e.g., from a diameter or other widthwise dimension of 4 inches to 6 inches, 8 inches, 10 inches, then 12 inches or more, the pressure provided by the fixed-force tools decreases linearly as a function of the increasing area of the bonded devices, which can reduce the efficacy of the bonding process. Accordingly, the techniques described above with reference to FIGS. 2-6 can facilitate forming suitable gallium nitride materials on large diameter wafers, without requiring the bonder to operate at forces beyond those for which they were built. This in turn can allow a manufacturer to produce large quantities of LEDs or other SSL devices using existing equipment.

Another feature of at least some of the foregoing embodiments is that they eliminate the need for implanting elements (e.g., hydrogen) in a substrate to facilitate separating a substrate layer (after bonding to a thermally tailored or matched substrate) in a later high-temperature process. Eliminating this process can improve the throughput of the overall manufacturing process.

The GaN material 120 described above can be used to form a variety of LEDs or other SSL devices having a corresponding variety of structural arrangements. In particular, such devices can be formed using a vertical arrangement or a lateral arrangement. In a vertical arrangement, the support substrate 112 is removed via a wet etch process, and the intermediate structure 114 can serve the additional function of a wet etch stop, thus facilitating efficiently removing the support substrate 112 and/or other material between the support substrate 112 and the intermediate structure 114. A wet chemical etch, a reactive ion etch (RIE) or other etching technique known to those having ordinary skill in the art can be used to remove the intermediate structure 114 and/or a metal layer (e.g., the seed material 116), as is typical for a vertical arrangement.

Figure 7A:
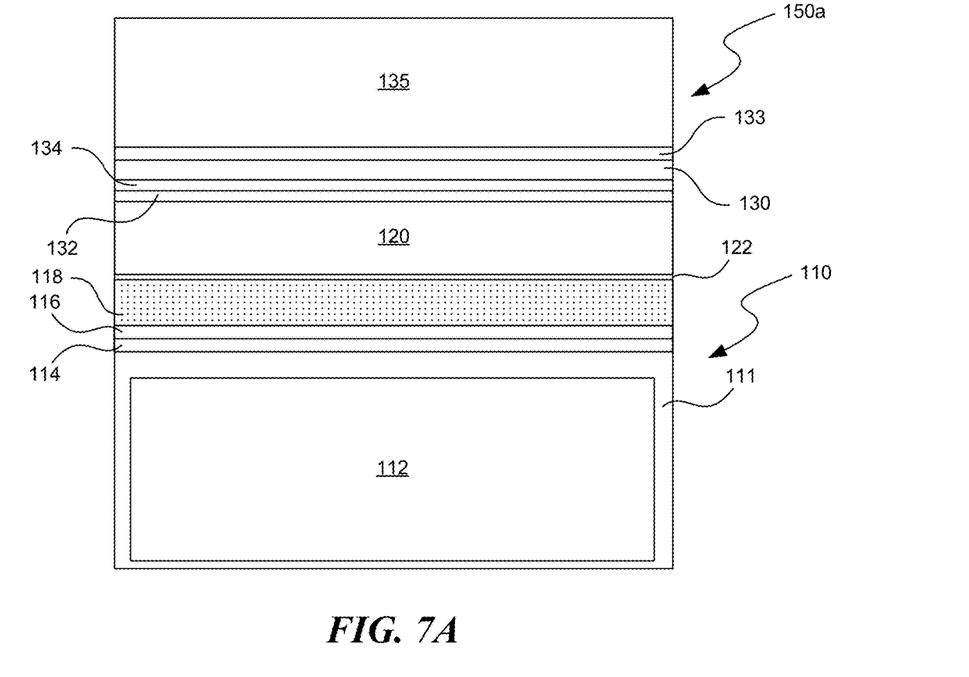
FIGS. 7A and 7B are partially schematic, cross-sectional illustrations of the support member shown in FIG. 5 during construction of a vertical LED structure in accordance with embodiments of the present disclosure.
Figure 7B:
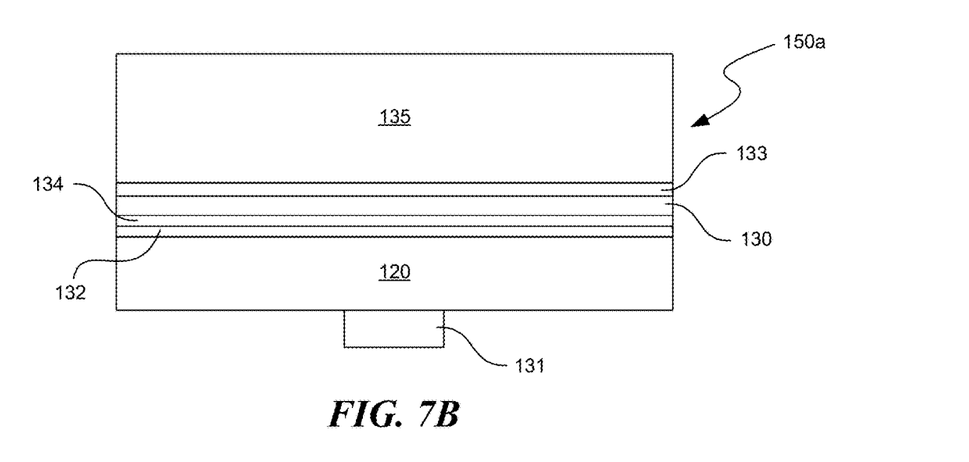

FIGS. 7A and 7B are partially schematic, cross-sectional illustrations of the support member 110 of FIG. 5 as it is used to construct a vertical LED structure 150a in accordance with an embodiment of the present disclosure. Beginning with FIG. 7A, epitaxially grown multiple quantum wells (MQWs), are formed on the GaN material 120 by alternating "well" material layers with "barrier" material layers in a manner known to those of ordinary skill in the relevant art, resulting in an active light-emitting region 132. A region of P-type GaN 134 is further formed on the light-emitting region. A P-contact 130 is formed on the P-type GaN region 134, and a bonding layer 133 (e.g., a gold-tin or nickel-tin alloy or other suitable bonding material) is formed on the P-contact 130. The bonding layer 133 is used to attach a suitable carrier 135 (e.g., a silicon wafer or submount, or a CuW carrier) to the support member 110. As shown in FIG. 7B, the support substrate 112 and the crystal-oriented material 118 are then etched off using a combination of wet chemistry, plasma etching, and/or grinding. At least a portion of the GaN material 120 includes N-type GaN. Accordingly, an N-contact 131 can be directly disposed on the GaN material 120, with the light-emitting region 132 between the N-contact 131 and the P-contact 130. Vertical cavity surface-emitting lasers (VCSELs) may be formed via a generally similar process.

Figure 8:
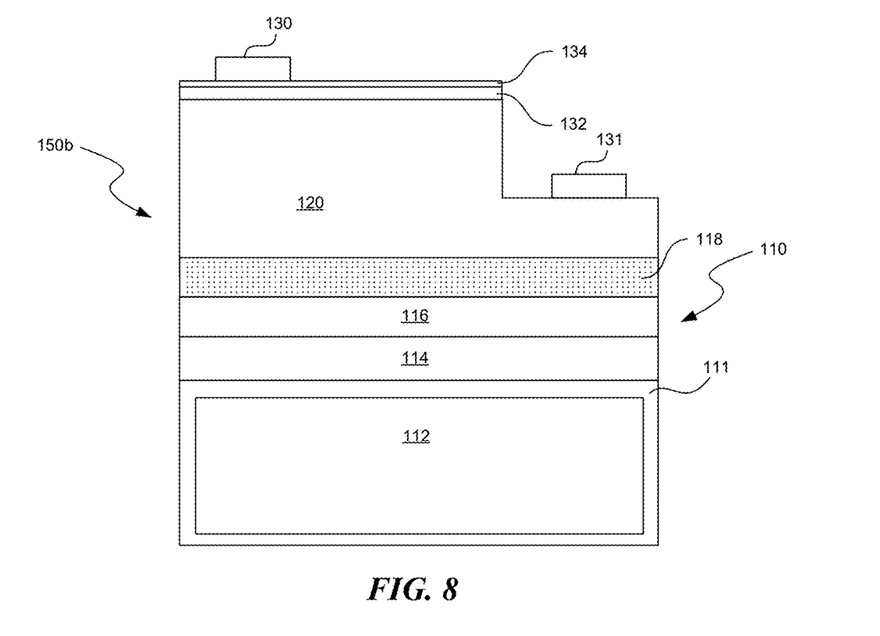
FIG. 8 is a partially schematic, cross-sectional illustration of the support member shown in FIG. 5 during construction of a vertical LED structure in accordance with embodiments of the present disclosure.

FIG. 8 is a partially schematic cross-sectional illustration of the support member 110 shown in FIG. 5 used to form a lateral LED structure 150b in accordance with another embodiment of the present disclosure. The device fabrication is carried out in a manner generally similar to that used for existing lateral arrangements. FIG. 8 illustrates a lateral LED 150b with both the P-contact 130 and the N-contact 131 on an upwardly-facing surface of the GaN material 120 on opposite sides of the light-emitting region 132, after etching a suitable portion of the P-region forming the P-contact 130, and the active region 132 below. The fabrication of semiconductor lasers, high-electron mobility transistors (HEMTs) and/or other diodes, rectifiers, photodetectors, and/or other suitable semiconductor devices is expected to follow a similar layout. The LED 150b shown in FIG. 8 can be used in a "flip chip" arrangement by inverting the LED 150b and connecting the contacts 130, 131 to a suitable PCB or other substrate.

In a particular embodiment, the portion of the support member 110 below the GaN material 120 (e.g., the crystal-oriented material 118, the seed material 116, the intermediate structure 114 and the support substrate 112) can be separated from the LED 150b. In another embodiment, the foregoing portion of the support member 110 can be left in place because (unlike the vertical LED 150a described above) it is not necessary to remove this material in order to form the N-contact 131. Accordingly, this arrangement can be used where the volume of the LED is a less significant design constraint, and/or where the cost of the LED is a more significant design constraint.

From the foregoing, it will be appreciated that specific embodiments of the technology have been described herein for purposes of illustration, but that various modifications may be made without deviating from the disclosed technology. For example, the materials disposed on the support substrate can be disposed in accordance with processes and/or process parameters different than those expressly described above. In one particular embodiment, the order in which the seed material 116 and the crystal-oriented material 118 (or its precursor, the initial material 117) are formed can be reversed from the arrangement shown in FIGS. 3-4C. That is, the seed material 116 can be disposed on the crystal-oriented material 118 rather than vice versa. In a particular embodiment, the seed material 116 can include nickel, and in other embodiments, it can include other elements or compounds. In any of these embodiments, the seed material 116 can perform the same function (e.g., facilitating the (111) crystal orientation of the crystal-oriented material 118) whether it is disposed before or after the crystal-oriented material 118. When it is disposed after the crystal-oriented material 118, it can be removed by a different etchant than is used to remove the crystal-oriented material 118, or by the same etchant, depending on the composition of the seed material 116, the crystal-oriented material 118, and the etchant. In any of these embodiments, an advantage of disposing the seed material 116 after the crystal-orientation material 118 is that it will be removed as part of the etching process and therefore will be less likely to influence (e.g., diffuse into) other structures. Conversely, disposing the seed material 116 before the crystal-oriented material 118 can, in at least some embodiments, provide a greater crystal orientation influence on the crystal-oriented material 118.

Certain aspects of the technology described in the context of particular embodiments may be combined or eliminated in other embodiments. For example, in one embodiment, the seed material described above can be combined with the intermediate structure. In other embodiments, the seed material can be formed directly on the support substrate without the need for the intermediate structure. In still further embodiments, both the seed material and the intermediate structure can be eliminated and the corresponding functions provided by these materials/structures can be carried out by a silicon dioxide layer formed directly on the support substrate or on the encapsulant carried by the support substrate. In other embodiments, certain process steps can be eliminated. For example, treating the crystal-oriented layer 118 can include etching or annealing, but not both, in at least some embodiments. Further, while advantages associated with certain embodiments have been described in the context of those embodiments, other embodiments may also exhibit such advantages, and not all embodiments need necessarily exhibit such advantages to fall within the scope of the present technology. Accordingly, the present disclosure and associated technology can encompass other embodiments not expressly shown or described herein.

We claim:

1. A solid state lighting device substrate, comprising:
   a support substrate comprising a polycrystalline material surrounded by an encapsulation layer comprising silicon nitride and having a widthwise dimension of at least six inches;
   a layer of polycrystalline silicon carried by the support substrate, wherein the layer of polycrystalline silicon includes more grains having (111) crystalline orientation than grains having crystalline orientations other than (111) crystalline orientation, and wherein the layer of polycrystalline silicon includes at least one grain having a crystalline orientation other than (111) crystalline orientation; and
   a layer of gallium nitride carried by the layer of polycrystalline silicon and having a thickness of at least 10 microns, wherein the layer of gallium nitride has a first major surface and an opposite second major surface, wherein the opposite second major surface of the layer of gallium nitride is farther from the support substrate than the first major surface of the layer of gallium nitride, and wherein the layer of gallium nitride has a (0001) crystal orientation at its second major surface.

2. The solid state lighting device substrate of claim 1 wherein the solid state lighting device substrate does not carry a light-emitting structure.

3. The solid state lighting device substrate of claim 1 wherein the thickness of the layer of gallium nitride is at least 50 microns.

4. The solid state lighting device substrate of claim 1 wherein the thickness of the layer of gallium nitride is at least 300 microns.

5. The solid state lighting device substrate of claim 1 wherein the widthwise dimension of the support substrate is about eight inches.

6. The solid state lighting device substrate of claim 1 wherein the widthwise dimension of the support substrate is about twelve inches.

7. The solid state lighting device substrate of claim 1 wherein the support substrate comprises polycrystalline aluminum nitride.

8. The solid state lighting device substrate of claim 1, further comprising a buffer material between the layer of polycrystalline silicon and the layer of gallium nitride.

9. The solid state lighting device substrate of claim 8 wherein the buffer material includes aluminum gallium nitride.

10. The solid state lighting device substrate of claim 1 wherein the layer of polycrystalline silicon is obtained by preferentially etching polycrystalline silicon to remove more grains having crystalline orientations other than (111) crystalline orientation than grains having (111) crystalline orientation, followed by an epitaxial regrowth process to increase sizes of grains having (111) crystalline orientation.

11. A solid state lighting device substrate, comprising:
a support substrate comprising polycrystalline aluminum nitride surrounded by an encapsulation layer comprising silicon nitride;
a layer of polycrystalline silicon carried by the support substrate, wherein the layer of polycrystalline silicon includes more grains having (111) crystalline orientation than grains having crystalline orientations other than (111) crystalline orientation, and wherein the layer of polycrystalline silicon includes at least one grain having a crystalline orientation other than (111) crystalline orientation; and
a layer of gallium nitride carried by the layer of polycrystalline silicon.

12. The solid state lighting device substrate of claim 11 wherein the support substrate has a widthwise dimension of at least six inches.

13. The solid state lighting device substrate of claim 11 wherein the support substrate has a widthwise dimension of about eight inches.

14. The solid state lighting device substrate of claim 11 wherein the support substrate has a widthwise dimension of about twelve inches.

15. The solid state lighting device substrate of claim 11 wherein the layer of gallium nitride has a thickness of at least 10 microns.

16. The solid state lighting device substrate of claim 11, further comprising a buffer material between the layer of polycrystalline silicon and the layer of gallium nitride.

17. The solid state lighting device substrate of claim 16 wherein the buffer material includes aluminum gallium nitride.

18. The solid state lighting device substrate of claim 11 wherein:
the layer of gallium nitride has a first major surface and an opposite second major surface;
the opposite second major surface of the layer of gallium nitride is farther from the support substrate than the first major surface of the layer of gallium nitride; and
the layer of gallium nitride has predominantly (0001) crystal orientation at its second major surface.

19. The solid state lighting device substrate of claim 11 wherein the layer of polycrystalline silicon is obtained by preferentially etching polycrystalline silicon to remove more grains having crystalline orientations other than (111) crystalline orientation than grains having (111) crystalline orientation, followed by an epitaxial regrowth process to increase sizes of grains having (111) crystalline orientation.

* * * * *